United States Patent
Costaganna

(10) Patent No.: US 6,207,580 B1
(45) Date of Patent: *Mar. 27, 2001

(54) METHOD OF PLASMA ETCHING THE TUNGSTEN SILICIDE LAYER IN THE GATE CONDUCTOR STACK FORMATION

(75) Inventor: Pascal Costaganna, Chailly en Biere (FR)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/266,336

(22) Filed: Mar. 11, 1999

(51) Int. Cl.$^7$ ................................................ H01L 21/3065
(52) U.S. Cl. .......................... 438/712; 438/712; 438/714; 438/721; 438/724
(58) Field of Search .................................. 438/706, 710, 438/711, 714, 720, 724, 721, 712, 742

(56) References Cited

U.S. PATENT DOCUMENTS

| | | | |
|---|---|---|---|
| 4,659,426 | * | 4/1987 | Fuller et al. .......................... 438/719 |
| 4,778,563 | * | 10/1988 | Stone .................................... 438/714 |
| 5,219,485 | * | 6/1993 | Wang et al. .......................... 252/79.3 |
| 5,338,398 | * | 8/1994 | Szwejkowski et al. ............. 438/720 |
| 5,591,301 | * | 1/1997 | Grewal ................................. 438/729 |
| 5,698,072 | * | 12/1997 | Fukuda ................................. 438/592 |
| 5,874,363 | * | 2/1999 | Hoh et al. ............................ 438/721 |

* cited by examiner

Primary Examiner—Benjamin L. Utech
Assistant Examiner—Binh X. Tran
(74) Attorney, Agent, or Firm—Jay H. Anderson

(57) ABSTRACT

A method of plasma etching a Si3N4 masked tungsten silicide layer down to an underlying doped polysilicon layer in the gate conductor stack formation process is disclosed. The method is performed in a plasma etcher and the etching mixture contains C12, HCl and O2 wherein the C12/HCl ratio is approximately equal to 4.7 and the oxygen flow varies between 20 and 30 sccm, 25 sccm being the optimal value. A slight overetching of the underlying doped polysilicon layer with this mixture is recommended. The etching method of the present invention preserves the thickness and integrity of the top Si3N4 masking layer that are essential elements for the successful completion of the remaining steps of the gate conductor stack formation process.

8 Claims, 5 Drawing Sheets

METHOD OF PLASMA ETCHING THE TUNGSTEN SILICIDE LAYER IN THE GATE CONDUCTOR STACK FORMATION

FIELD OF INVENTION

The present invention relates to the manufacture of semiconductor integrated circuits (ICs) and more particularly to an improved method of plasma etching a silicon nitride masked tungsten silicide layer in the gate conductor stack formation that preserves the silicon nitride mask integrity.

BACKGROUND OF THE INVENTION

In the manufacture of advanced semiconductor ICs, particularly in DRAM chips, Insulated Gate Field Effect Transistors (IGFETs) are extensively used. FIG. 1A schematically shows a portion of a semiconductor wafer at the initial stage of the gate conductor (GC) stack formation. In FIG. 1A, there is shown a conventional semiconductor structure 10 comprising a silicon substrate 11 coated by a thin 10 nm silicon oxide (SiO2) layer 12 (the gate dielectric of the IGFETs) with the GC stack 13 formed thereon. The GC stack 13 typically consists of a plurality of adjacent layers: a bottom 100 nm thick arsenic doped polysilicon layer 14, a 80 nm thick tungsten silicide (WSix) layer 15 and a 280 nm thick top silicon nitride (Si3N4) layer 16. The deposition of a refractory metal silicide (e.g. WSix) over a layer of polysilicon is extensively used in the semiconductor industry, forming a composite structure usually referred to as a polycide layer. A photoresist layer 17 is formed over the GC stack 13 as standard. The GC stack 13 delineation process starts with the patterning of the photoresist layer 17 to produce the desired mask. This photoresist mask is used to selectively etch the exposed portions of the underlying Si3N4 top layer 16. The resulting structure is shown in FIG. 1B. The photoresist mask 17 is then stripped by ashing in ozone and structure 10 is cleaned as standard. The next step consists in transferring the pattern in the underlying tungsten silicide layer 15 using the Si3N4 top layer 16 as an in-situ hard mask. This step is monitored by an optical etch end point system to detect the WSix/doped polysilicon interface.

A number of chemistries have been developed so far for the elective etching of tungsten silicide with regards to the silicon nitride material of layer 16. However, only a few employ oxygen as a passivating component to improve etch uniformity. When oxygen is used, it is always with a very low proportion in the etching mixture. For instance, the Applicant used a Cl2/HCl/O2 chemistry with a LAM TCP 9400 plasma etcher, an equipment sold by LAM Research Corp., Fremont, Calif., USA.

The following operating conditions were:
Cl2 flow: 40 sccm
HCl flow: 80 sccm
O2 flow : 3 sccm
Pressure: 5 mtorr
RF frequency: 13.56 Mhz
TCP power: 200 W
Bias power: 300 W
wherein "sccm" denotes standard cubic centimeters per minute.

There are two RF generators, one for the TCP (transformer coupled plasma) to increase the plasma density in order to improve etch rate and uniformity and the other one to insure the plasma to be more ionic. In view of the respective gas flows indicated above, the selected ratio is thus in percent: 32.6% Cl2, 65% HCl and 2.4% O2. The Si3N4:WSix etch selectivity of this mixture is about 2.33:1.

As a matter of fact, a very low oxygen percentage is used during this step to improve etch uniformity (micro-loading effects) between nested (or dense) and isolated (or open) areas of the wafer.

This step is very important because it is essential to preserve the thickness and the integrity of the remaining portions of the Si3N4 top layer 16 as it will be discussed in more details hereinafter. In addition, the etching of the doped polysilicon layer 14 is initiated during this step, and it is also very important that the polysilicon etching be anisotropically performed to ensure a straight profile of the of the polysilicon material being etched.

Now, the doped polysilicon layer 14 is etched using a Cl2/O2 mixture, still in the LAM plasma etcher mentioned above. The composition change aims to increase selectivity between doped polysilicon and SiO2 to preserve gate oxide layer integrity.

The following operating conditions are:
Cl2 flow: 20 sccm
O2 flow : 3 sccm
Pressure: 5 mtorr
RF frequency: 13.56 Mhz
TCP power: 200 W
Bias power: 50 W The wafer is cleaned in a DHF solution as standard to remove the SiOx formed on the gate oxide layer 12 during this step. At this stage of the GC stack fabrication process, the structure is shown in FIG. 1C. As apparent in FIG. 1C, the remaining portions of the GC stack 13 have the general shape of lines, referred to hereinbelow as the GC lines and still bearing numeral 13.

In the above described etch process, the step of etching the tungsten silicide through the Si3N4 top layer 16 that will be subsequently used as an in-situ hard mask is by far the most critical. The Cl2/HCl/O2 chemistry described above has two major drawbacks. Firstly, it etches in excess the Si3N4 top layer 16. As a matter of fact, because of the high density plasma and chlorine flow, the Si3N4 top layer thickness is reduced from 280 nm to 250 nm, so that, as apparent in FIG. 1C, there is a significant erosion of the original Si3N4 top layer. Secondly, although the GC lines 13 are shown in FIG. 1C with a vertical profile, it should be understood that in reality the angle θ defined by the GC line lateral side and the substrate surface is given in TABLE I below. The values (in degrees) are given both for the nested (dense) and the isolated regions of the wafer considering separately the edge and center zones thereof. These values are not satisfactory for the subsequent processing steps.

TABLE I

|  | isolated | nested |
| --- | --- | --- |
| edge | 85° | 86° |
| center | 83° | 86° |

The GC stack fabrication process continues with the formation of silicon nitride spacers coating the lateral sides of the GC lines 13. To that end, a 60 nm thick Si3N4 sidewall protection layer is conformally deposited by LPCVD onto the structure 10 and anisotropically etched in an RIE reactor using an optical etch end point system to detect the gate oxide layer exposure. The Si3N4 spacers are referenced 18 in FIG. 1D.

Now, the structure 10 needs to be planarized. To that end, a 570 nm thick layer 19 of BPSG is blanket deposited by PECVD onto the FIG. 1D structure. The BPSG material forming layer 19 has the double role of an insulating and planarizing medium. However, because, the BPSG layer surface is not perfectly planar, a chem-mech polishing step is required to get a mirror-like surface and reduce the BPSG layer thickness to 440 nm. At this stage of the GC stack fabrication process, the resulting structure 10 is shown in FIG. 1E.

Finally, a photolithographic step is performed in order to define a contact opening 20 through the BPSG layer 19 and the gate oxide layer 12 to expose the silicon substrate 11 prior to source and drain regions formation. To that end, the BPSG layer 19 is etched in a TEL 85 SDRM, a RIE etcher manufactured by TOKYO ELECTRON Ltd, Tokyo, JA.

The following operating conditions are adequate:
C4F8 flow: 18 scam
CO flow: 300 scam
Ar flow: 380 scam
Pressure: 57 mtorr
RF frequency: 13.56 Mhz
Bias power: 1400 W A phosphorous ions implant is then conducted to form said source and drain regions of the IGFETs such as region referenced 21 in FIG. 1F. Now turning to FIG. 1F, the erosion of the Si3N4 layer 16 produced during the WSix etching step, causes some areas of the remaining portions of the WSix layer 15 to be exposed at locations 22 during the contact opening 20 formation. Unfortunately, when during the next step, opening 20 is filled with a metal to define the MO "borderless" contact with region 21 as standard, an electrical short is produced between region 21 and the gate conductor making thereby the corresponding IGFET inoperative.

A GC stack fabrication process limited to the above sequence of steps illustrated by reference to FIGS. 1A to 1C is described in the Int. Appl. published under the PCT No W096/27899, the only noticeable change is that silicon nitride has replaced the SiO2 material as the stack top layer. As a matter of fact, Si3N4 is now preferred because it has a higher selectivity than SiO2 with respect to the BPSG material forming layer 19 which is used for the contact opening formation. With the continuous trend towards integration density increase, the BPSG material reveals to be an essential element to reach the small dimensions and the high aspect ratios (vertical profiles) that are now required in advanced ICs. In particular, the BPSG material allows to fill totally the space between two GC lines 13 without any void, as apparent in FIG. 1E, thanks to its high pouring capability.

SUMMARY OF THE PRESENT INVENTION

It is therefore a primary object of the present invention to provide an improved method of plasma etching a Si3N4 masked tungsten silicide layer formed on a substrate.

It is another object of the present invention to provide a method of plasma etching a Si3N4 masked tungsten silicide layer formed on a doped polysilicon layer in the gate conductor stack formation that preserves the Si3N4 top masking layer thickness and integrity.

It is another object of the present invention to provide a method of plasma etching a Si3N4 masked tungsten silicide layer formed on a doped polysilicon layer in the gate conductor stack formation that eliminates source or drain region/gate conductor shorts.

It is another object of the present invention to provide a method of plasma etching a Si3N4 masked tungsten silicide layer formed on a doped polysilicon layer in the gate conductor stack formation that produces GC lines with a substantially vertical profile.

It is still another object of the present invention to provide a method of plasma etching a Si3N4 masked tungsten silicide layer formed on a doped polysilicon layer in the gate conductor stack formation that improves device quality factors such as the final test yield and the long retention limited yield.

The accomplishment of these and other related objects is achieved by the method of the present invention. According to the broader scope of that method, a Si3N4 masked tungsten silicide layer formed on a substrate is etched in a plasma etcher with an etching mixture containing C12, HCl, and O2 wherein the C12/HCl ratio is approximately equal to 4.7 and the oxygen flow varies between 20 and 30 sccm, 25 sccm being the optimal value. When the method of the present invention is applied to etch a Si3N4 masked tungsten silicide layer formed on a doped polysilicon layer in the course of the gate conductor stack formation, the same etch process is performed with advantageously a slight overetching of the underlying doped polysilicon layer.

The novel features believed to be characteristic of this invention are set forth in the appended claims. The invention itself, however, as well as these and other objects and advantages thereof, will be best understood by reference to the following detailed description of an illustrated preferred embodiment to be read in conjunction with the accompanying drawings.

DESCRIPTION OF A PREFERRED EMBODIMENT

Applicant's inventor has discovered that unexpectedly relatively high level of oxygen in the above described chemistry could be profitable and significantly improve the tungsten silicide etch step by preserving the patterned Si3N4 top layer thickness and integrity. Although, the method of the present invention, such as disclosed hereinbelow, has been developed on an AME 5000 system equipped with an electrostatic chuck device in a M×P chamber, it can be extended to other plasma etcher tools.

The novel chemistry gives the high Si3N4/WSix selectivity that is required to preserve the masked Si3N4 top layer thickness and integrity and the desired etch anisotropy during WSix etching, which are essential elements to produce the desired vertical profiles at the end of the GC stack fabrication process. The idea at the base of the present invention is thus to use an unusually high oxygen content in the Cl2/HCl/O2 gas mixture. The novel etch chemistry has been found to drastically limit the erosion of the masked Si3N4 top layer while providing both the desired anisotropy mentioned above and lateral passivation of the WSix layer of the GC lines 13 which prevents any subsequent exposure thereof during the doped polysilicon etching step. As a final consequence, the electrical shorts mentioned above do not exist any longer. However, oxygen is known to be a serious detractor of many parameters of the GC stack fabrication process. The experiments that were conducted by Applicant's inventor therefore aimed to adjust the adequate oxygen content range.

Figure 2:
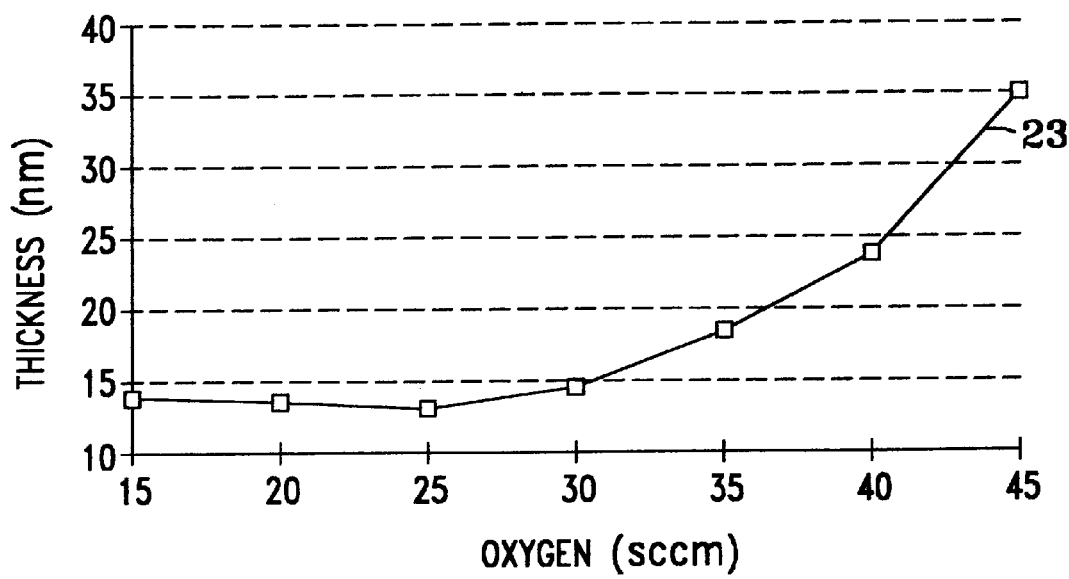
FIG. 2 is a plot showing the thickness (in nm) of the gate oxide layer remaining after completion of the GC stack formation process as a function of oxygen flow (in sccm) in a C12/HCl/O2 based chemistry.
Figure 3:
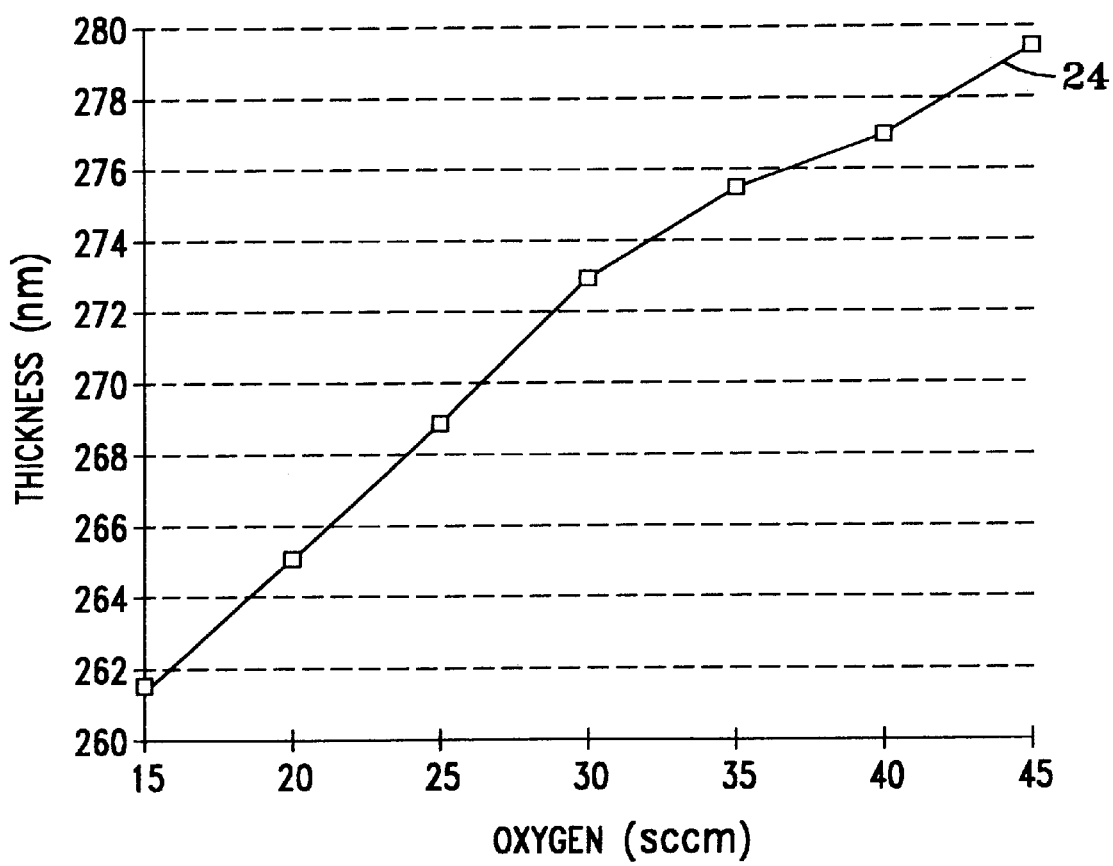
FIG. 3 is a plot showing the thickness (in nm) of the silicon nitride top layer remaining after completion of the GC stack formation process as a function of oxygen flow (in sccm) in a C12/HCl/O2 based chemistry.
Figure 4:
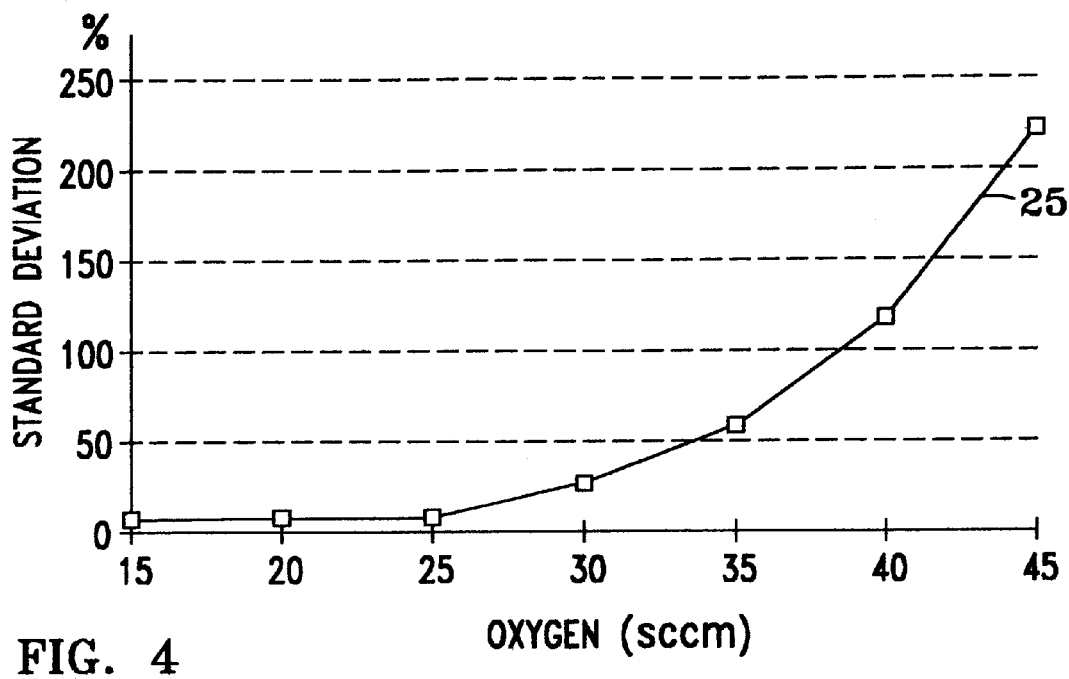
FIG. 4 is a plot showing the variation (standard deviation in percent) of the gate oxide layer thickness after completion of the GC stack formation process as a function of oxygen flow (in sccm) in a C12/HCl/O2 based chemistry to demonstrate the influence of the oxygen flow on the gate oxide layer thickness non-uniformity.

In the Cl2/HCl/O2 chemistry of the present invention, HCl is still used to remove the native oxide which naturally forms at the WSix layer surface and to reduce GC line profile deviation between nested and isolated areas of the wafer. On the other hand, Cl2 is still required to remove WSix material with a high etch rate and good uniformity control, but it also etches the doped polysilicon because of its low WSix:polysilicon selectivity (about 0.8:1). Now, according to the present invention, oxygen becomes a key parameter of the new WSix etch process. A high oxygen content provides the adequate Si3N4/WSix selectivity and the necessary etch anisotropy to produce the desired vertical profiles at the end of the GC stack fabrication process. However, a high oxygen content may detrimentally affect many others parameters, for instance, it may inhibit the polysilicon etch rate and in turn, increase the non-uniformity of both the thickness of the gate oxide layer remaining at the wafer surface and the GC line profiles between nested and isolated areas. These parameters are essential to device quality factors such as long retention limited yield, delta L and final test yield. FIGS. 2 to 4 show the influence of the oxygen content in the Cl2/HCl/O2 mixture on these and other important process parameters. In the experiments described hereunder, where in the oxygen flow varies from 15 sccm to 45 sccm, the respective Cl2, HCl and O2 percentages are given in table II below. For each point indicated in the plots depicted in FIGS. 2 to 4, nine measurements have been performed at different locations of the sample wafer (typically along a central cross as standard) and it is the average value which is reported in the plot, except when otherwise stated.

TABLE II

| Oxygen | Mixture content (in percent) | | |
|---|---|---|---|
| (in sccm) | O2 | HCl | Cl2 |
| 15 | 15.0 | 15.0 | 70.0 |
| 20 | 19.0 | 14.3 | 66.7 |
| 25 | 22.7 | 13.6 | 63.6 |
| 30 | 26.1 | 13.0 | 60.9 |
| 35 | 29.2 | 12.5 | 58.3 |
| 40 | 32.0 | 12.0 | 56.0 |
| 45 | 34.6 | 11.5 | 53.8 |

Now turning to FIG. 2, curve 23 shows the thickness (in nm) of the gate oxide layer for the sample wafer that remains at the end of the GC stack fabrication process as a function of the oxygen flow (in sccm). During the doped polysilicon etching, SiOx is formed on the gate oxide layer, increasing thereby the original 10 nm thickness, however, this material is not too much resistant and is easily removed during the DHF clean step mentioned above. As apparent in FIG. 2, when the oxygen flow increases, the average value of the remaining gate oxide thickness increases too. It is recommended to have the thickness of the gate oxide (SiO2+SiOx) layer less than 15 nm, i.e. to have an oxygen flow not greater than 30 sccm. Higher values could be reveal to be detrimental to the gate oxide layer integrity later on.

In FIG. 3, curve 24 shows the value of the thickness (in nm) of the Si3N4 top layer that remains at the end of the GC stack fabrication process as a function of the oxygen flow (in sccm). The remaining thickness increases as the oxygen flow increases demonstrating thereby that the greater the oxygen flow the greater the Si3N4/WSix selectivity, so that, for that parameter a high oxygen flow would be preferred. As apparent in FIG. 3, an oxygen flow less than 25 sccm would not be acceptable, because it would lead to a thickness of the remaining Si3N4 layer below 269 nm, which is not secure enough for the etch process.

FIG. 4 shows a plot referenced 25 that illustrates the standard deviation (in percent) of the gate oxide layer thickness across the wafer still as a function of the oxygen flow (in sccm). The significant increase of the standard deviation for a high oxygen flow is mainly driven by the GC lines located in the nested areas at the wafer center. This plot, which is related in some respect to the plot depicted in FIG. 2, is quite representative of the non-uniformity aspect.

TABLE III below summarizes the results depicted in the plots of FIGS. 2 to 4.

TABLE III

| Oxygen (sccm) | Gate Ox. (nm) | Si3N4 (nm) | Std dev. (G.Ox.) (%) |
|---|---|---|---|
| 15 | 13.3 | 261.3 | 2.6 |
| 20 | 13.3 | 264.8 | 2.6 |
| 25 | 13.2 | 268.9 | 2.8 |
| 30 | 14.7 | 272.9 | 20.7 |
| 35 | 18.6 | 275.6 | 55.7 |
| 40 | 23.9 | 277.0 | 110.2 |
| 45 | 35.4 | 279.4 | 216.8 |

Figure 5:
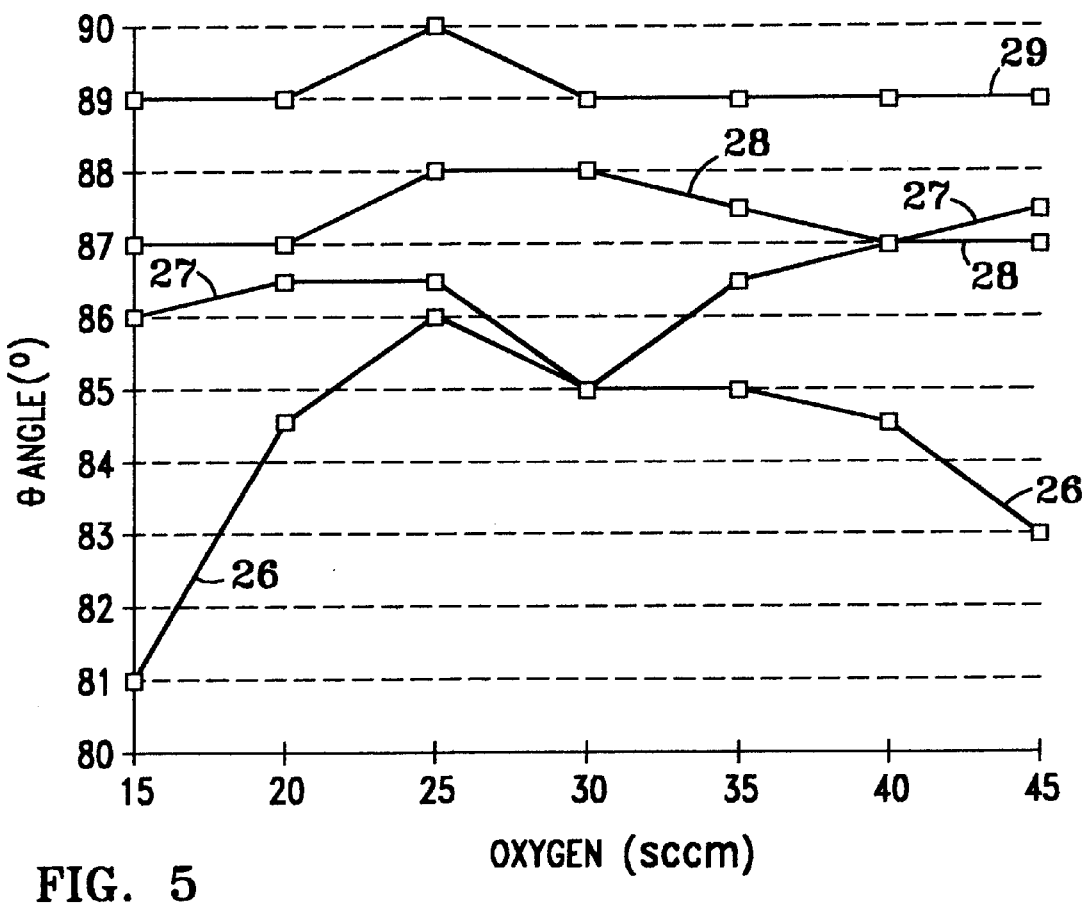
FIG. 5 is a plot showing the GC line profiles represented by the angle θ (in degrees) formed by the GC line lateral side with the substrate surface after completion of the GC stack formation process as a function of oxygen flow (in sccm) in a C12/HCl/O2 based chemistry in the four cases where the GC lines are situated in the isolated/nested areas and at the wafer edge/center.

FIG. 5 shows plots that relate to the GC line profiles. Curves 26 and 27 show the variations of the angle θ for the GC lines in the isolated areas at the center and at the edge of the wafer respectively. Curves 28 and 29 show the variations of the angle θ for the GC lines in the nested areas at the center and at the edge of the wafer respectively. As apparent in FIG. 5, the best compromise between edge and center areas is obtained for an oxygen flow of about 25 scam, although the whole 20–30 range appears satisfactory in some respects. It is interesting to note that for an oxygen flow of 25 scam, the θ angle is equal to 90° for the nested regions at the edge of the wafer, and moreover, for that particular value the dispersion between the four angle θ values is minimal, typically it varies from 86° to 90° as apparent in FIG. 5. TABLE IV below summarizes the results shown in the plots of FIG. 5. Its reading allows an easy comparison with the corresponding numbers of TABLE I.

TABLE IV

| Oxygen (sccm) | Angle θ (in °) | | | |
|---|---|---|---|---|
| | isolated | | nested | |
| | center | edge | center | edge |
| 15 | 81.0 | 86.0 | 87.0 | 89.0 |
| 20 | 84.5 | 86.5 | 87.0 | 89.0 |
| 25 | 86.0 | 86.5 | 88.0 | 90.0 |
| 30 | 85.5 | 86.0 | 88.0 | 88.0 |
| 35 | 85.0 | 86.5 | 87.5 | 89.0 |
| 40 | 84.5 | 87.0 | 87.0 | 89.0 |
| 45 | 83.0 | 87.5 | 87.0 | 89.0 |

Let us now consider the teachings of the plots depicted in FIGS. 2 to 5. An oxygen flow equal or superior to 30 scam in the C12/HCl/O2 chemistry produces an inhibition of the etch capability of this etching mixture. In this case, micro-masking defects so-called "grass" are created. Another consequence of a high oxygen flow is the uniformity down-grading due to micro-loading effects. Isolated areas at the wafer edge are etched earlier and stronger than the nested areas at the center of the wafer. These teachings are clearly apparent in FIGS. 2, 3 and 4. On the other hand, the oxygen flow should not be too low if one wants to avoid the above mentioned problems associated with the prior art mixture compositions, i.e. low selectivity and non-uniformity. As a matter of fact, when the oxygen flow varies from 45 scam to 15 scam, the Si3N4:WSix selectivity is reduced from 133:1 to 4.3:1. In addition, as shown in FIG. 5, under 20 scam, GC line profiles decrease drastically from 86° to 81° in the isolated areas at the center of the wafer, which is clearly unacceptable.

Therefore, to properly etch a Si3N4 masked tungsten silicide layer in the GC stack fabrication process, it is required to have a significant oxygen content in the mixture but not too much. As result, the process window is relatively small. The 20–30 sccm range appears acceptable (with a C12/HCl ratio equal to approximately 4.7) although the preferred range is clearly 20–25 sccm. An oxygen flow of about 25 sccm appears to be the optimal value and is obviously satisfactory in all respects to guarantee a successful etch process. For a 25 sccm oxygen flow, the Si3N4/WSix selectivity is equal to 7.2:1, a much higher value that the selectivity (2.33:1) that was obtained with the previous chemistry and the LAM TCP plasma etcher.

The best operating conditions (still for the AME 5000 plasma etcher) are:
HCl flow: 15 sccm
C12 flow: 70 sccm
O2 flow : 25 sccm
Power: 450 Watt
Pressure: 20 mTorr
Magnetic field: 20 Gauss
DC voltage: –700 volts The best compromise for the chemistry is thus the following composition in percent: C12:63,6 %, HCl:13,6 % and O2:22,7 %, and the adequate range (in percent) for the oxygen content is from 19 to 23%, assuming that the values given above for the respective C12 and HCl flow ratios are kept maintained constant and equal to about 4.7.

Figure 1A:
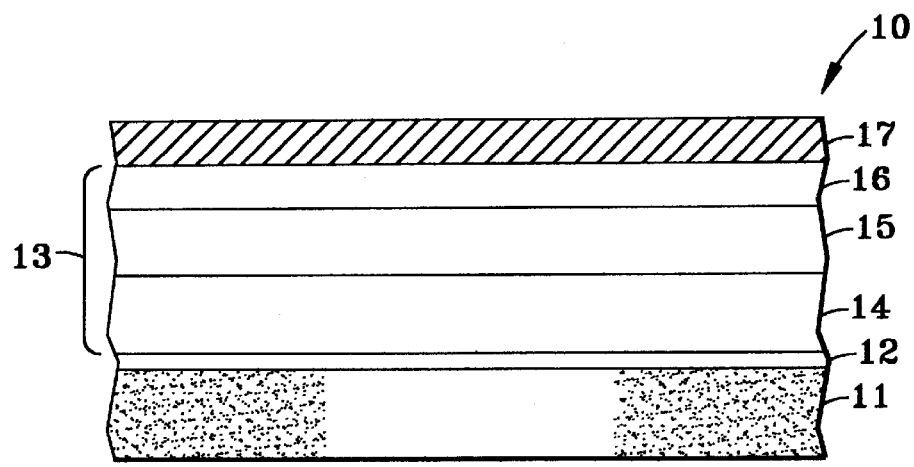
FIGS. 1A to 1F show a semiconductor structure undergoing the GC stack formation process.
Figure 1B:
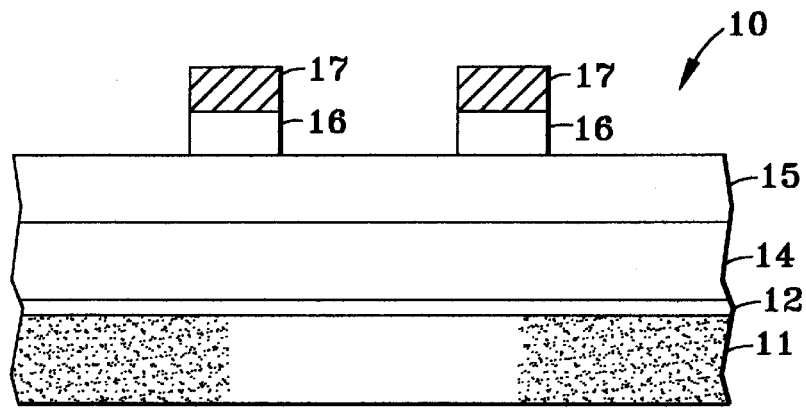
Figure 1C:
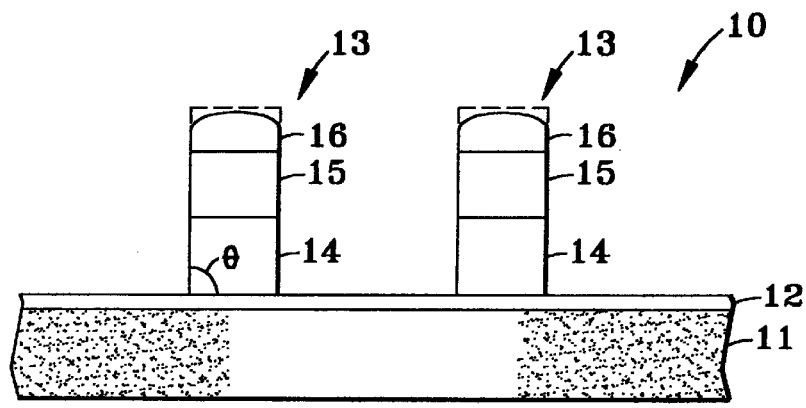
Figure 1D:
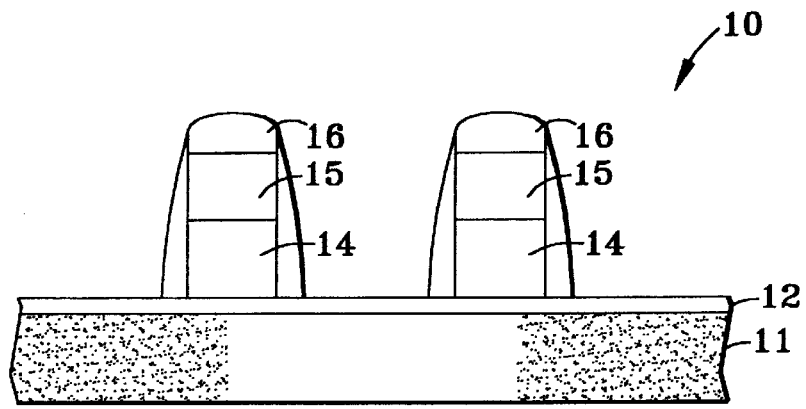
Figure 1E:
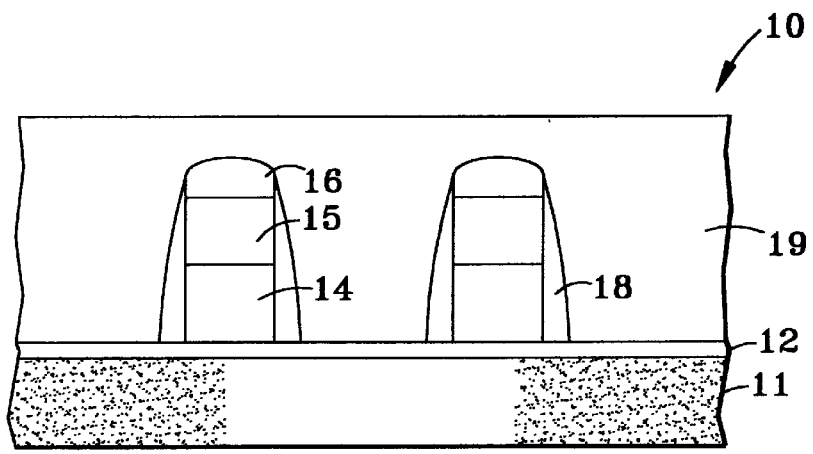
Figure 6A:
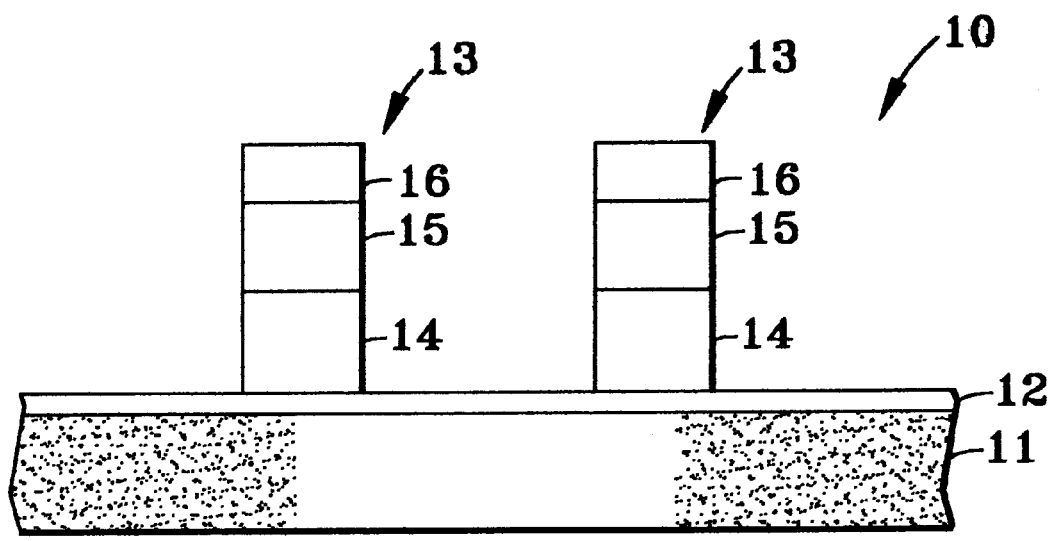
FIG. 6A and 6B show the semiconductor structure of FIG. 1A at the respective stages of FIG. 1C and 1F in the course of the completion of the GC stack formation process when the method of the present invention is used.
Figure 6B:
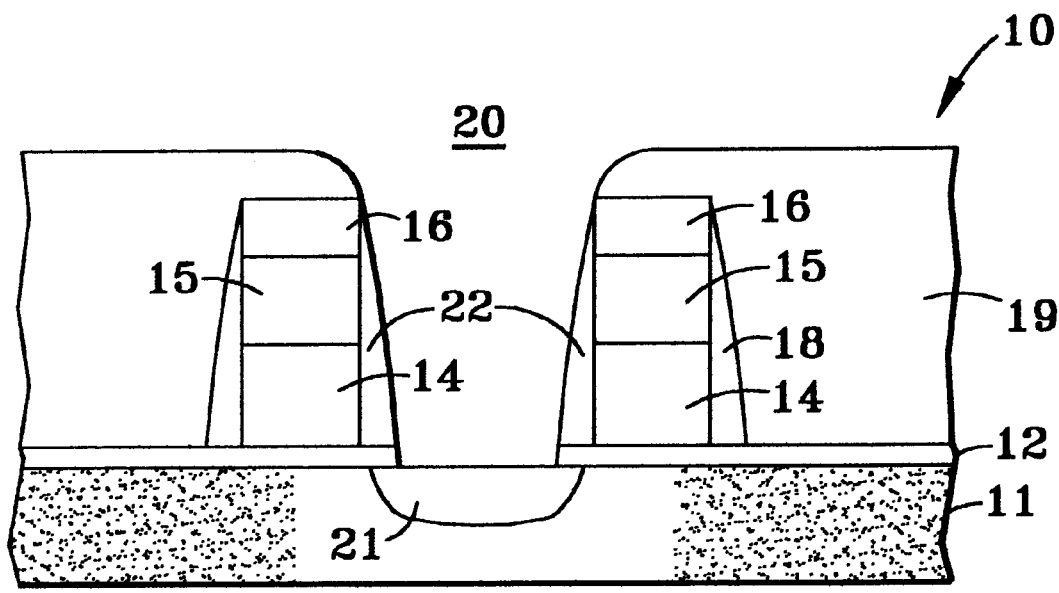

The remaining steps of the above described GC stack fabrication process described above are then performed without any change. FIGS. 6A and 6B respectively show structure 10 at the stage of FIGS. 1C and 1F for comparison purposes. As apparent in FIG. 6A, the remaining portions of the patterned Si3N4 top layer 16 now remain unaffected by the WSix/doped polysilicon etch process and the original thickness is substantially preserved. Integrity of these portions that will be subsequently used as an in-situ hard mask is a guarantee to produce a reliable metal contact with implanted region 21 at the end of the GC stack formation process.

Figure 1F:
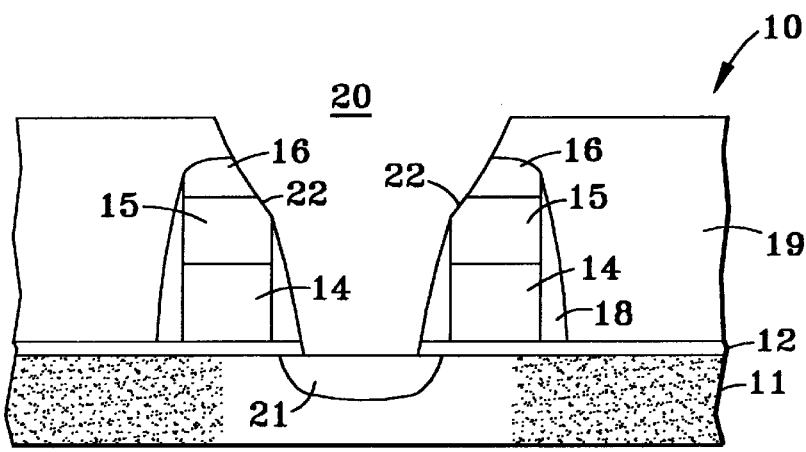

The finished structure is shown in FIG. 6B, which is to be compared with the FIG. 1F structure. As apparent in FIG. 6B, there is no longer any part of the WSix layer exposed, on the contrary, they are well protected by Si3N4 spacers 22, avoiding thereby the risk of the electrical shorts mentioned above.

The new etch method has many advantages when compared to the conventional one. As far as the GC stack formation process is concerned, the manufacturing yields increase from 83 to 92% when the method of the present invention is used.

What is claimed is:

1. Method of plasma etching a $Si_3N_4$ masked tungsten silicide layer formed on a substrate comprising the steps of:
    (a) providing a plasma etch reactor having a wafer holder whereupon the substrate is mounted;
    (b) providing (1) an etching mixture containing $Cl_2$, HCl and $O_2$ in said reactor wherein the $Cl_2$/HCl ratio is approximately equal to 4.7 and the oxygen flow varies between 20 and 30 sccm, and (2) a power of more than 200 watts to produce a plasma environment;
    (c) exposing the substrate to said plasma environment for a time sufficient to etch the tungsten silicide layer down to the substrate anisotropically, thereby obtaining an etched tungsten silicide feature having a lateral dimension substantially equal to that of the Si3N4 mask.

2. Method of plasma etching a $Si_3N_4$ masked tungsten silicide layer formed on a doped polysilicon layer overlying a substrate comprising the steps of:
    (a) providing a plasma etch reactor having a wafer holder whereupon the substrate is mounted;
    (b) providing (1) an etching mixture containing $Cl_2$, HCl and $O_2$ in said reactor wherein the $Cl_2$/HCl ratio is approximately equal to 4.7 and the oxygen flow varies between 20 and 30 sccm and (2) a power of more than 200 watts to produce a plasma environment;
    (c) exposing the substrate to said plasma environment for a time sufficient to etch the tungsten silicide layer down to the doped polysilicon layer anisotropically, thereby obtaining an etched tungsten silicide feature having a lateral dimension substantially equal to that of the $Si_3N_4$ mask.

3. The method of claim 2 further comprising the step of:
    d) performing a slight overetching of the underlying doped polysilicon layer for a period of about 10% of the etch time.

4. The method of claim 1 or 2 wherein the oxygen flow is equal to 25 sccm.

5. Method of plasma etching a $Si_3N_4$ masked tungsten silicide layer formed on a substrate comprising the steps of:
    (a) providing a plasma etch reactor having a wafer holder whereupon the substrate is mounted;
    (b) providing (1) an etching mixture containing $Cl_2$, HCl and $O_2$ in said reactor wherein the $Cl_2$/HCl ratio is approximately equal to 4.7 and the oxygen flow varies between 20 and 30 sccm and is greater than the HCl flow, and (2) a power of more than 200 watts to produce a plasma environment;
    (c) exposing the substrate to said plasma environment for a time sufficient to etch the tungsten silicide layer down to the substrate anisotropically, thereby obtaining an etched tungsten silicide feature having a lateral dimension substantially equal to that of the $Si_3N_4$ mask.

6. Method of plasma etching a $Si_3N_4$ masked tungsten silicide layer formed on a doped polysilicon layer overlying a substrate comprising the steps of:

(a) providing a plasma etch reactor having a wafer holder whereupon the substrate is mounted;

(b) providing (1) an etching mixture containing $Cl_2$, HCl and $O_2$ in said reactor wherein the $Cl_2$/HCl ratio is approximately equal to 4.7 and the oxygen flow varies between 20 and 30 sccm and is greater than the HCl flow, and (2) a power of more than 200 watts to produce a plasma environment;

(c) exposing the substrate to said plasma environment for a time sufficient to etch the tungsten silicide layer down to the doped polysilicon layer anisotropically, thereby obtaining an etched tungsten silicide feature having a lateral dimension substantially equal to that of the $Si_3N_4$ mask.

7. The method of claim 6 further comprising the step of:

(d) performing a slight overetch of the underlying doped polysilicon layer for a period of about 10% of the etch time.

8. The method of claim 5 or 6 wherein the oxygen flow is equal to 25 sccm.

* * * * *